(12) United States Patent
Hung et al.

(10) Patent No.: US 11,415,601 B2
(45) Date of Patent: Aug. 16, 2022

(54) RESISTOR HAVING LOW TEMPERATURE COEFFICIENT OF RESISTANCE

(71) Applicant: CYNTEC CO., LTD., Hsinchu (TW)

(72) Inventors: Tzu-Hao Hung, Hsinchu (TW); Ying-Da Luo, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 286 days.

(21) Appl. No.: 16/708,349

(22) Filed: Dec. 9, 2019

(65) Prior Publication Data

US 2020/0200799 A1    Jun. 25, 2020

Related U.S. Application Data

(60) Provisional application No. 62/783,208, filed on Dec. 21, 2018.

(51) Int. Cl.
| | |
|---|---|
| *G01R 1/20* | (2006.01) |
| *G01R 19/00* | (2006.01) |
| *H01C 1/14* | (2006.01) |
| *H01C 7/06* | (2006.01) |

(52) U.S. Cl.
CPC .......... *G01R 1/203* (2013.01); *G01R 19/0092* (2013.01); *H01C 1/14* (2013.01); *H01C 7/06* (2013.01)

(58) Field of Classification Search
CPC .... G01R 1/203; G01R 19/0092; G01R 15/18; H01C 1/14; H01C 1/148
See application file for complete search history.

(56) References Cited

U.S. PATENT DOCUMENTS

| | | | | |
|---|---|---|---|---|
| 8,198,977 B2 * | 6/2012 | Smith | ................ | H01C 17/28 |
| | | | | 338/25 |
| 8,884,733 B2 * | 11/2014 | Hetzler | ................ | H01C 7/001 |
| | | | | 338/7 |
| 2011/0057764 A1 | 3/2011 | Smith | | |
| 2013/0120104 A1 | 5/2013 | Li | | |
| 2013/0181807 A1 * | 7/2013 | Hetzler | ................ | H01C 7/001 |
| | | | | 338/7 |

(Continued)

FOREIGN PATENT DOCUMENTS

| | | |
|---|---|---|
| CN | 102696079 A | 9/2012 |
| CN | 103106990 A | 5/2013 |

(Continued)

*Primary Examiner* — Dominic E Hawkins
(74) *Attorney, Agent, or Firm* — Winston Hsu

(57) ABSTRACT

A resistor having low temperature coefficient of resistance includes a resistive part and two conductive parts connected to opposite sides of the resistive part. One conductive part has a through slot and a sensing portion between the through slot and the resistive part. The through slot has two interconnected sections. Each section extends and ends with a closed end and has a parallel component, parallel to a main current direction defined on the resistor, and a perpendicular component, perpendicular to the main current direction. Another resistor having low temperature coefficient of resistance includes a resistive part and two conductive parts connected to two sides of the resistive part respectively. Each conductive part has a protrusion block, extending outward perpendicular to a main current direction defined on the resistor, and a sensing portion at the protrusion block.

14 Claims, 12 Drawing Sheets

(56) References Cited

U.S. PATENT DOCUMENTS

| | | | |
|---|---|---|---|
| 2014/0266568 A1 | 9/2014 | Cheng | |
| 2015/0323567 A1* | 11/2015 | Kitahara | G01R 19/15 |
| | | | 324/126 |
| 2016/0139211 A1* | 5/2016 | Yoshioka | G01R 31/364 |
| | | | 324/437 |
| 2017/0125142 A1 | 5/2017 | Nakamura | |
| 2017/0212150 A1* | 7/2017 | Kang | G01R 19/00 |
| 2018/0188295 A1 | 7/2018 | Kameko | |
| 2018/0286542 A1* | 10/2018 | Kobayakawa | G01R 1/203 |

FOREIGN PATENT DOCUMENTS

| | | |
|---|---|---|
| CN | 103180916 A | 6/2013 |
| CN | 104376938 A | 2/2015 |
| CN | 105874338 A | 8/2016 |
| CN | 107683417 A | 2/2018 |
| JP | 59-54204 A | 3/1984 |
| JP | 2607-221006 A | 8/2007 |
| JP | 2007-329421 A | 12/2007 |
| JP | 2009-266977 A | 11/2009 |
| JP | 2013-504213 A | 2/2013 |
| JP | 2014-45104 A | 3/2014 |
| JP | 2015-204315 A | 11/2015 |
| WO | 2012/019784 A1 | 2/2012 |

\* cited by examiner

RESISTOR HAVING LOW TEMPERATURE COEFFICIENT OF RESISTANCE

CROSS REFERENCE TO RELATED APPLICATIONS

This application claims the benefit of U.S. Provisional Application No. 62/783,208 filed on Dec. 21, 2018 which is incorporated herein by reference.

BACKGROUND OF THE INVENTION

1. Field of the Invention

The present invention relates to a four terminal current sense resistor of low temperature coefficient of resistance.

2. Description of the Related Art

Current sense resistors have been available for the electronic market for many years. Their construction typically includes a flat strip of a resistive material that is coupled between high conductivity metal terminals forming the main terminals of the resistor. A pair of sensing terminals can be formed in the main terminals thereby creating a four terminal device. The main terminals carry the majority of the current through the resistor. The sensing terminals produce a sensing voltage that is proportional to the current passing through the resistor. Such resistors provide a mechanism to monitor the current using conventional voltage sensing techniques. The actual current passing through the resistor can be determined based on the sensed voltage and the resistance value of the resistor as dictated by ohms law. An ideal device would have a Temperature Coefficient of Resistance (TCR) that is close to zero. However, most devices have a non-zero TCR that can lead to inaccurate sensing voltage readings at the sensing terminals particularly when the temperature of the device varies. Furthermore, the main terminals are usually made of copper. Copper has a TCR of 3900 ppm/° C. while the resistive material is typically less than 100 ppm/° C., which makes the sensing terminals show a higher TCR than desired, resulting in significant deviation in monitoring the current passing through the device.

SUMMARY OF THE INVENTION

The present disclosure provides a resistor having low temperature coefficient of resistance, using an obstructing structure for reducing the sensing voltage deviation of a current passing through the resistor.

A resistor having low temperature coefficient of resistance of an embodiment according to the invention includes a resistive part, a first conductive part, and a second conductive part. The resistor thereon defines a main current direction. The first conductive part is connected to a side of the resistive part in the main current direction. The first conductive part has a first sensing portion and a through slot. The first sensing portion is located between the first through slot and the resistive part. The through slot includes a first slot section and a second slot section which are located at two opposite sides of the first sensing portion relative to the main current direction and connected with each other. The first slot section extends from a first start point along a first path toward the resistive part and ends with a closed end. The second slot section extends from the first start point along a second path toward the resistive part and ends with a closed end. The first path has a first parallel component, parallel to the main current direction, and a first perpendicular component, perpendicular to the main current direction. The second path has a second parallel component, parallel to the main current direction, and a second perpendicular component, perpendicular to the main current direction. The second conductive part is connected to another side of the resistive part in the main current direction. The second conductive part has a second sensing portion. Thereby, the through slot can obstruct a current passing through the resistor so as to effectively reduce the sensing voltage deviation of the current through the first sensing portion and the second sensing portion.

A resistor having low temperature coefficient of resistance of another embodiment according to the invention includes a resistive part, a first conductive part, and a second conductive part. The resistor thereon defines a main current direction. The first conductive part is connected to a side of the resistive part in the main current direction. The first conductive part has a first protrusion block extending outward perpendicular to the main current direction and ending with an end perpendicular to the main current direction. The first conductive part has a first sensing portion at the first protrusion block. The second conductive part is connected to another side of the resistive part in the main current direction. The second conductive part has a second sensing portion. The first sensing portion and the second sensing portion are disposed at two sides of the resistive part respectively. Thereby, the first protrusion block forms an obstructing structure for reducing the sensing voltage deviation of a current passing through the resistor through the first sensing portion and the second sensing portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
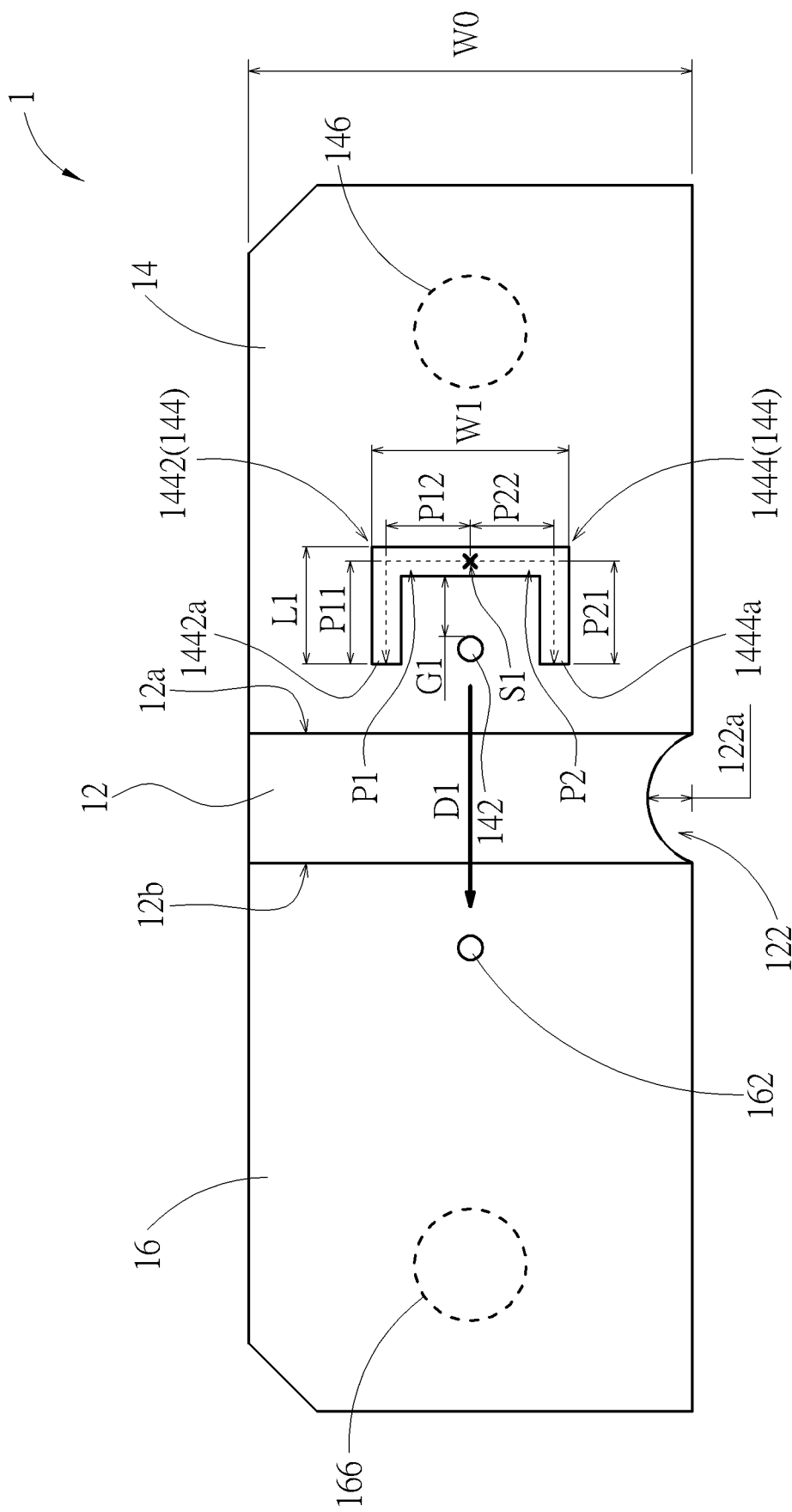
FIG. 1 is a top view of a resistor of an embodiment according to the invention.

Please refer to FIG. 1. A resistor 1 having low temperature coefficient of resistance according to an embodiment includes a resistive part 12, a first conductive part 14, and a second conductive part 16. The resistor 1 thereon defines a main current direction D1 (indicated by an arrow in FIG. 1). The first conductive part 14 is connected to a side 12a of the resistive part 12 in the main current direction D1. The first conductive part 14 has a first sensing portion 142 (indicated by a circle in FIG. 1), a first through slot 144, and a first connecting portion 146 (indicated by a dashed circle in FIG. 1). The first sensing portion 142 is located between the first through slot 144 and the resistive part 12. The first through slot 144 is located between the first connecting portion 146 and the first sensing portion 142 along the main current direction D1. The second conductive part 16 is connected to another side 12b of the resistive part 12 opposite to the first conductive part 14 in the main current direction D1. The second conductive part 16 has a second sensing portion 162 (indicated by a circle in FIG. 1) and a second connecting portion 166 (indicated by a dashed circle in FIG. 1). When the resistor 1 is in operation, a current passes through the resistor 1 substantially in the main current direction D1, for example form the first connecting portion 146 to the second connecting portion 166. The first through slot 144 is close to the first sensing portion 142 relative to the first connecting portion 146 and is located between the first connecting portion 146 and the first sensing portion 142, so that the first through slot 144 can obstruct the current and therefore can effectively reduce the sensing voltage deviation of the current through the first sensing portion 142 and the second sensing portion 162.

In the embodiment, the resistor 1 as a whole shows a plate form. In practice, the resistive part 12 can be made of, for example but not limited to an alloy of Cu, Ni, and Mn. The first conductive part 14 and the second conductive part 16 can be made of, for example but not limited to an alloy of Cu. In principle, the resistive part 12 has a higher resistivity and a 10 times lower conductivity than the first conductive part 14 and the second conductive part 16. Furthermore, in practice, the first sensing portion 142 and the second sensing portion 162 can be a solder pad or fix a pin or screw thereon or form a threaded hole for convenience of connecting with an external sensing circuit on PCB used for measuring the sensed voltages through the first sensing portion 142 and the second sensing portion 162. Similarly, the first connecting portion 146 and the second connecting portion 166 can be a solder pad or fix a pin or screw thereon or form a threaded hole for convenience of connecting with an external power unit for providing electric current (electric power) to the external power unit, e.g. battery, motor, motor driving unit, charger unit or control unit etc. passing through the resistors 1. In addition, in some embodiments, the second conductive part 16 is connected to another side of the resistive part 12 rather than the opposite side 12b. The current will flow in accordance with this connection configuration, from the side 12a to said side. This connection configuration is suitable for curved installation space. In practice, this connection configuration may cause an uneven current density distribution, the sizes of the resistive part 12, the first conductive part 14 and the second conductive part 16 may need to be enlarged accordingly.

Furthermore, in the embodiment, the first through slot 144 includes a first slot section 1442 and a second slot section 1444 which are located at two opposite sides of the first sensing portion 142 relative to the main current direction D1 and connected with each other. In other words, in the view of FIG. 1, the first slot section 1442 extends upward; the second slot section 1444 extends downward. The first slot section 1442 extends from a first start point S1 (indicated by a cross mark in FIG. 1) along a first path P1 (indicated by dashed lines with an arrow in FIG. 1) toward the resistive part 12 and ending with a closed end 1442a. The second slot section 1444 extends from the first start point S1 along a second path P2 (indicated by dashed lines with an arrow in FIG. 1) toward the resistive part 12 and ends with a closed end 1444a. The first path P1 has a first parallel component P11, parallel to the main current direction D1, and a first perpendicular component P12, perpendicular to the main current direction D1. The second path P2 has a second parallel component P21, parallel to the main current direction D1, and a second perpendicular component P22, perpendicular to the main current direction D1. The first parallel component P11, the first perpendicular component P12, the second parallel component P21, and the second perpendicular component P22 are nonzero. In the embodiment, the first start point S1 (i.e. where the first slot section 1442 and the second slot section 1444 are connected) is located substantially on a line that passes through the first sensing portion 142 and the first connecting portion 146 parallel to the main current direction D1.

Because of the existence of the first through slot 144 and the extension of two ends of the first through slot 144 toward the resistive part 12, the current density at the first sensing portion 142 decreases, which reduces the sensing voltage deviation of the current passing through the resistor 1 through the first sensing portion 142 and the second sensing portion 162. In other words, the resistor 1 with the first through slot 144 as a whole has a lower TCR than the resistor 1 without the first through slot 144 as a whole. In addition, in the embodiment, the resistor 1 has an indentation 122 formed at an edge of the resistive part 12, e.g. by laser trimming, milling, punching, or other methods capable of removing material from the resistor 1. The indentation 122 has a depth 122a selected to adjust the resistance of the resistor 1.

Figure 2:
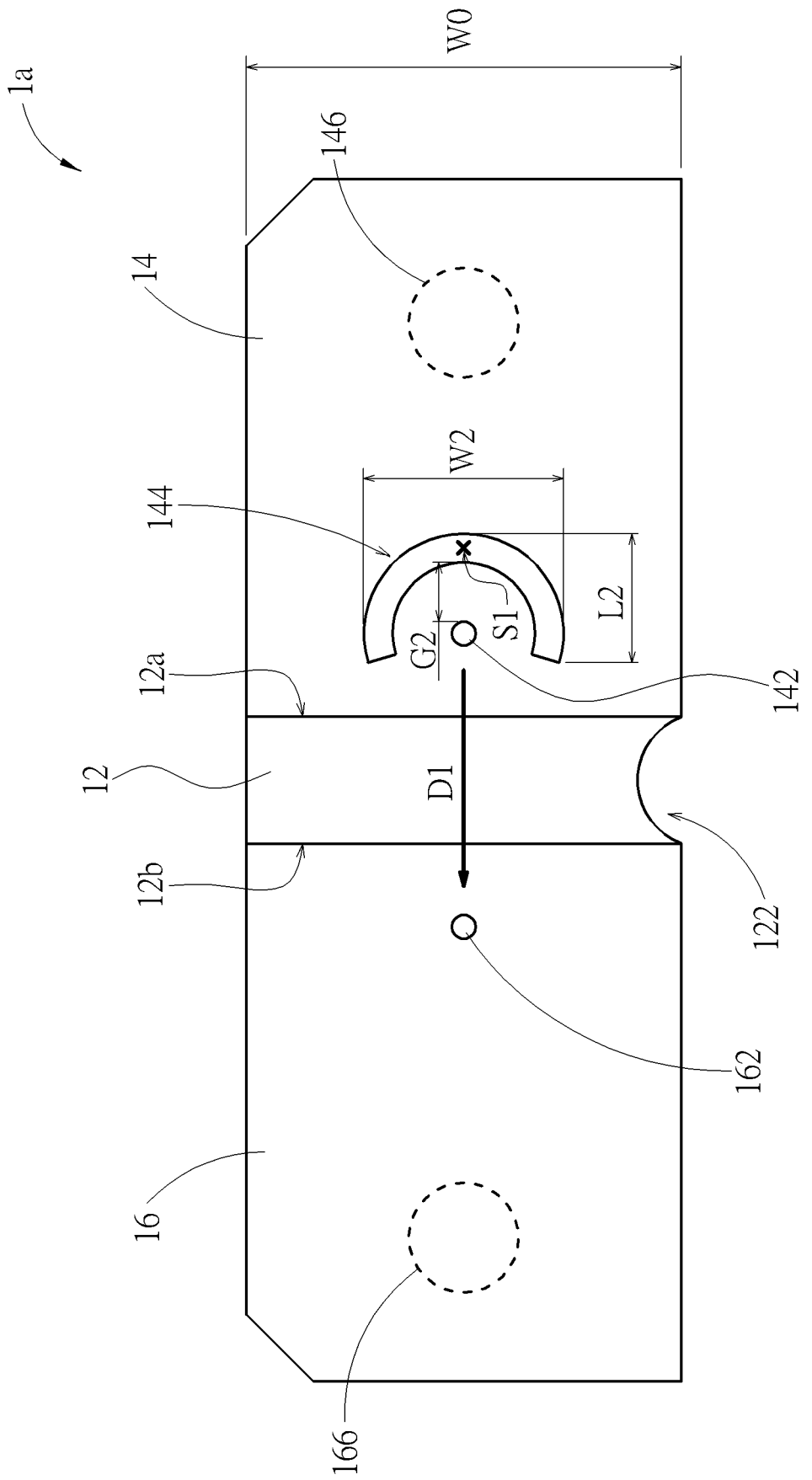
FIG. 2 is a top view of a resistor with a C-shaped through slot of another embodiment.
Figure 3:
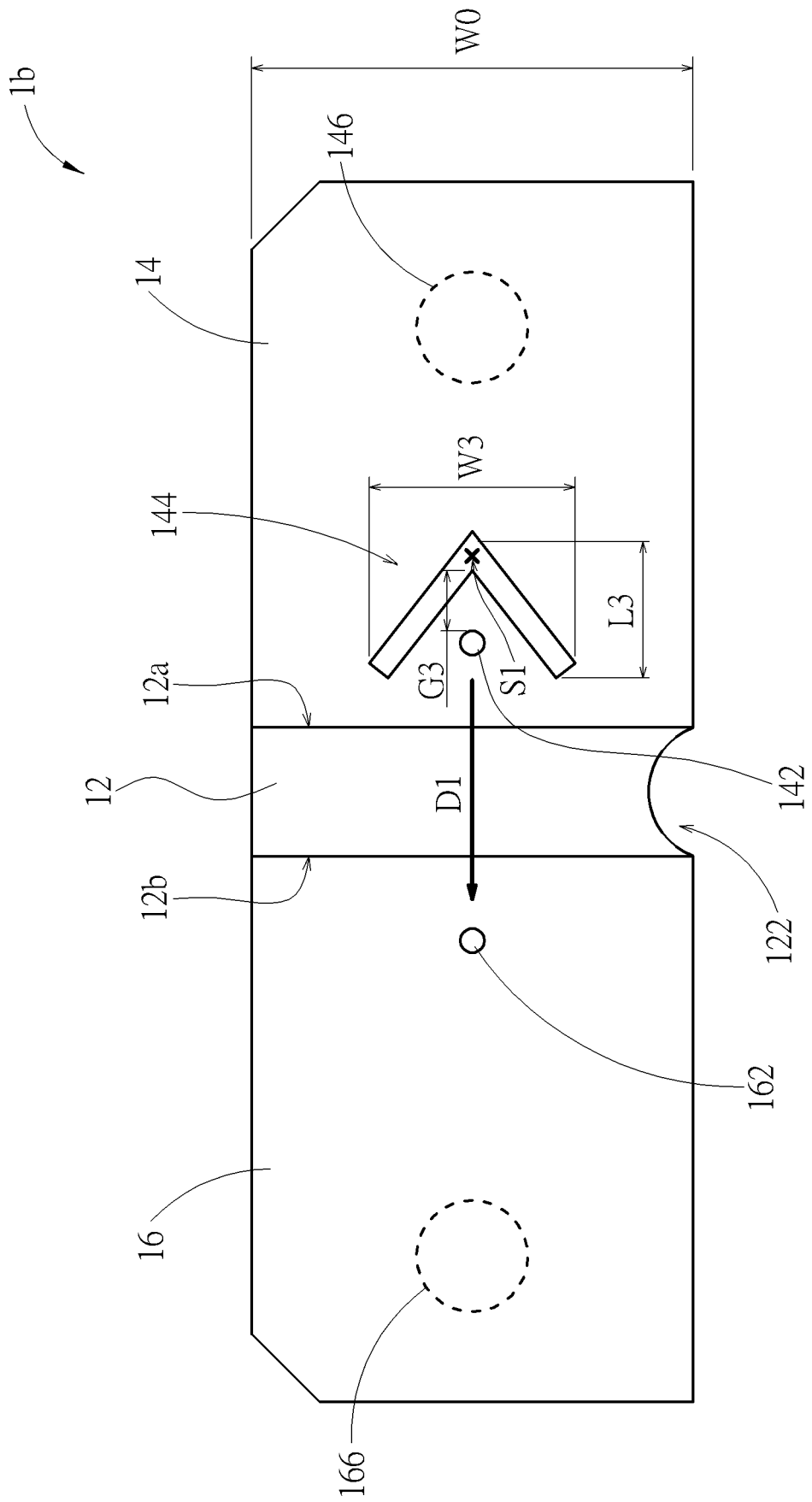
FIG. 3 is a top view of a resistor with an angle bracket through slot of another embodiment.
Figure 4:
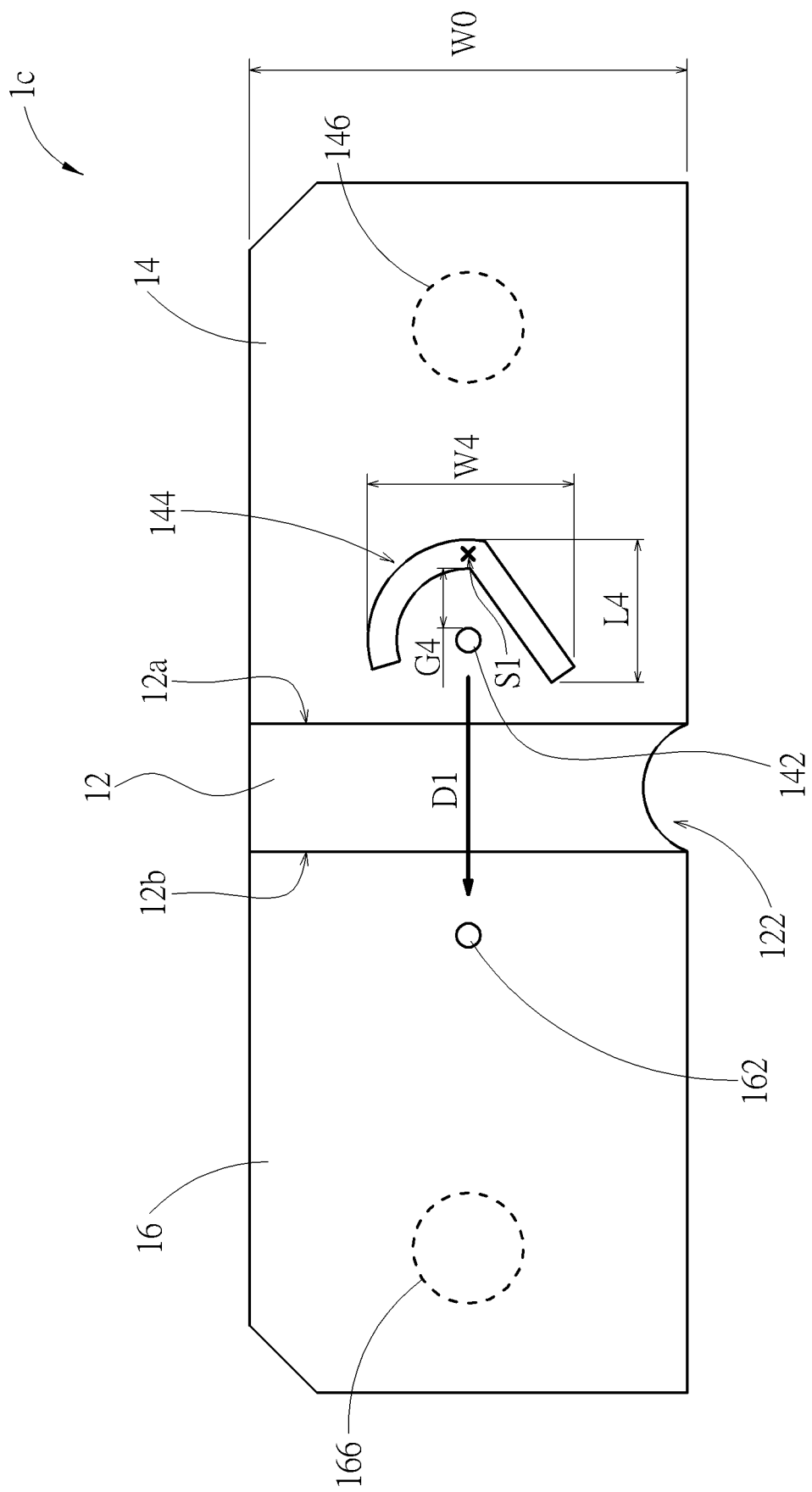
FIG. 4 is a top view of a resistor with an arc-and-line through slot of another embodiment.

In the embodiment, the first through slot 144 as shown is provided in form of a square or rectangular bracket. The first slot section 1442 and the second slot section 1444 are symmetrical relative to the main current direction D1 or the first sensing portion 142, and are provided in form of an L-shape. However, it is not limited thereto in practice. For example, the first through slot 144 of a resistor 1a can be provided in form of a C-shape, as shown by FIG. 2; therein, the first slot section 1442 and the second slot section 1444 are provided in form of an arc. In practice, the C-shape can be a semi-circle or an arc of a circle corresponding to a central angle of over 30 degrees (preferably, within a range of 30 to 330 degrees). For another example, the first through slot 144 of a resistor 1b can be formed in form of an angle bracket, as shown by FIG. 3; therein, the first slot section 1442 and the second slot section 1444 are provided in form of a straight line (or an oblique line). For another example, the first slot section 1442 and the second slot section 1444 of the first through slot 144 of a resistor 1c are asymmetrical relative to the main current direction D1 or the first sensing portion 142, as shown by FIG. 4; therein, the first slot section 1442 is provided in form of an arc while the second slot section 1444 is provided in form of a straight line.

Please refer to FIG. 1 to FIG. 4. In practice, the TCR of the resistors 1, 1a, 1b and 1c decrease as the projection lengths L1, L2, L3 and L4 of the first through slot 144 in the main current direction D1 increase. The TCR of the resistors 1, 1a, 1b and 1c also decrease as the projection lengths W1, W2, W3 and W4 of the first through slot 144 in a direction perpendicular to the main current direction D1 increase. The TCR of the resistors 1, 1a, 1b and 1c also decrease as the gap G1, G2, G3 and G4 between the first sensor portion 142 and the first through slot 144 (e.g. the distance between the first sensor portion 142 and the first start point S1) decrease. The sensing voltage of the resistors 1, 1a, 1b and 1c decrease as the projection lengths L1, L2, L3 and L4 of the first through slot 144 in the main current direction D1 increase. The sensing voltage of the resistors 1, 1a, 1b and 1c also decrease as the projection lengths W1, W2, W3 and W4 of the first through slot 144 in a direction perpendicular to the main current direction D1 increase. Under the same temperature, for maintaining the same sensing voltage (i.e. without changing the measurement deviation), it is necessary to increase the width W0, so that the size and cost of the resistors 1, 1a, 1b and 1c increases. In practice, for consideration to the structural strength, accuracy and suitable size of the first conductive part 14, the projection lengths W1, W2, W3 and W4 of the first through slot 144 can be designed to be less than a half of the width W0 of the first conductive part 14 in the direction perpendicular to the main current direction D1.

Figure 5:
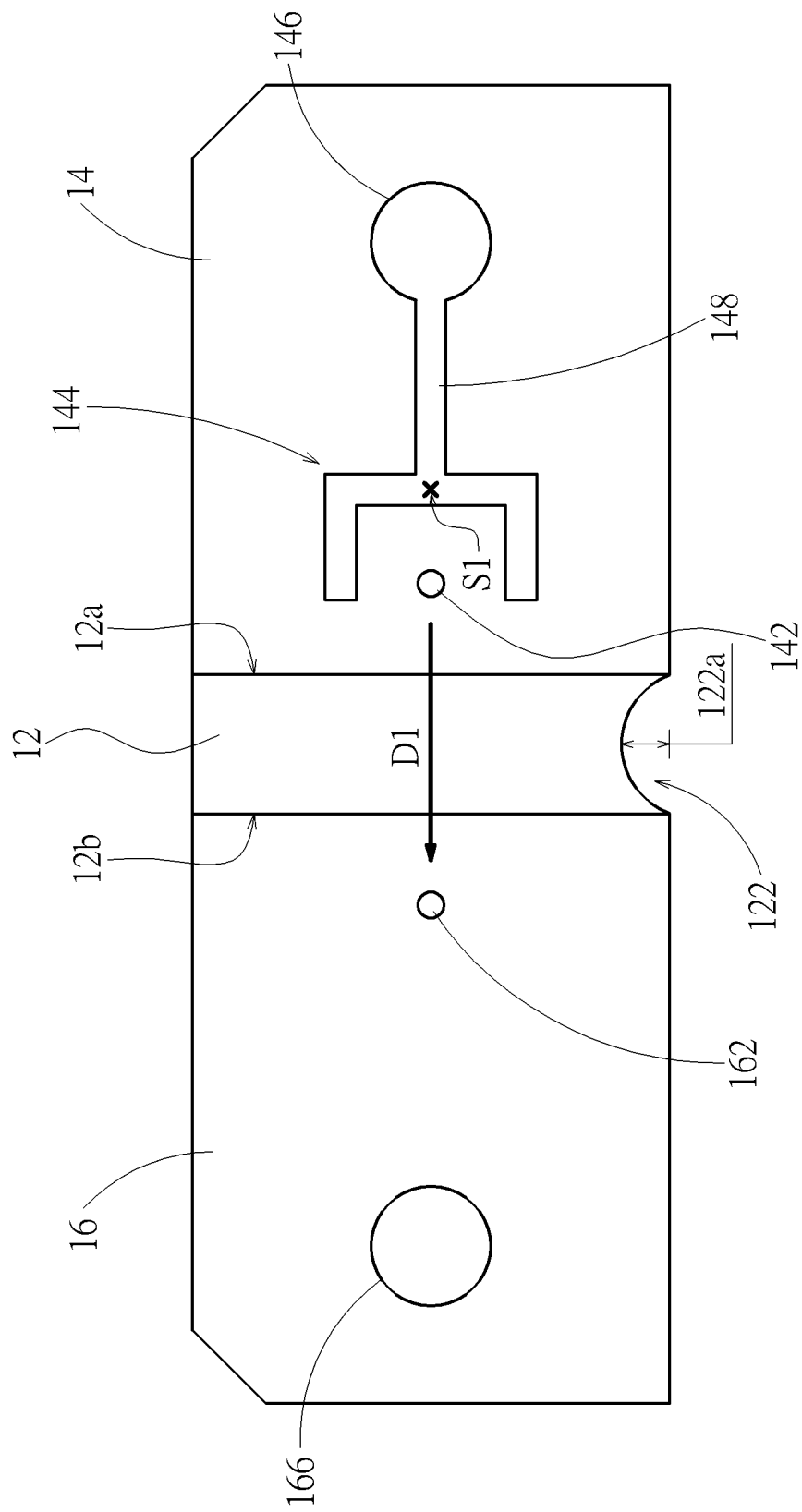
FIG. 5 is a top view of a resistor with an attachment slot of another embodiment.

In practice, the first connecting portion 146 may be formed with a structure in coordination with an external structure, e.g. for attaching a PCB or other attachments thereon. As shown by FIG. 5, the first connecting portion 146 is a connecting hole (e.g. a simple hole or threaded hole). The first conductive part 14 has an extension through slot 148 that connects the first through slot 144 and the connecting hole (i.e. the connecting portion 146). The extension through slot 148 is also applicable to the resistor 1a, 1b and 1c, which will not be described in addition.

Figure 6:
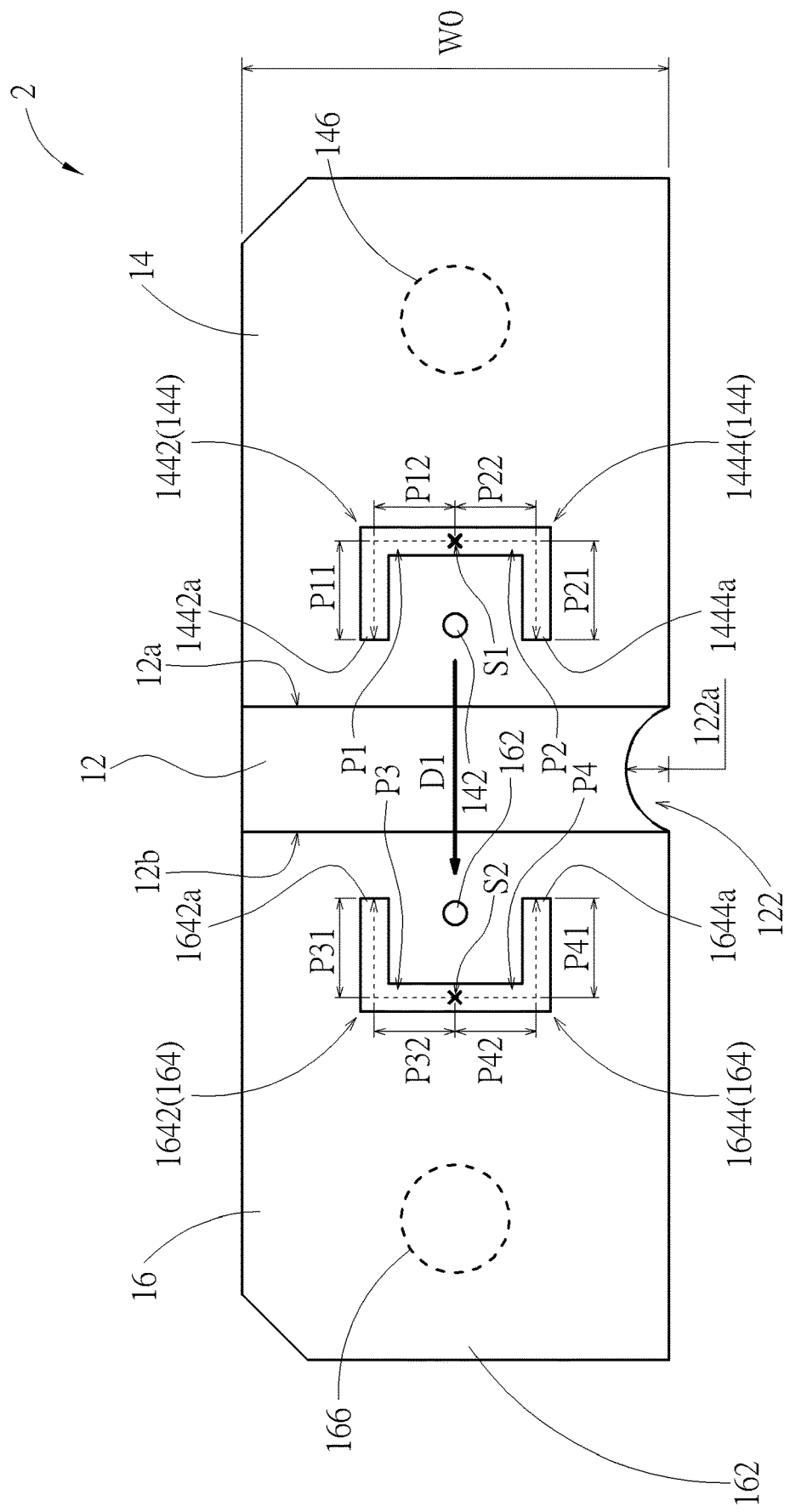
FIG. 6 is a top view of a resistor of another embodiment according to the invention.

Please refer to FIG. 6. A resistor 2 having low temperature coefficient of resistance according to another embodiment is structurally similar to the resistor 1 and therefore uses the reference numbers of the resistor 1. For other descriptions about the resistor 2, please refer to the relevant descriptions of the resistor 1 and the variations thereof, which will not be repeated in addition. In resistor 2, the second conductive part 16 further has a second through slot 164. The second sensing portion 162 is located between the second through slot 164 and the resistive part 12; the second through slot 164 is located between the second connecting portion 166 and the second sensing portion 162 along the main current direction D1. The second through slot 164 includes a third slot section 1642 and a fourth slot section 1644 which are located at two opposite sides of the second sensing portion 162 relative to the main current direction D1 and connected with each other. In other words, in the view of FIG. 6, the third slot section 1642 extends upward; the fourth slot section 1644 extends downward. The third slot section 1642 extends from a second start point S2 (indicated by a cross mark in FIG. 6) along a third path P3 (indicated by dashed lines with an arrow in FIG. 6) toward the resistive part 12 and ends with a closed end 1642a. The fourth slot section 1644 extends from the second start point S2 along a fourth path P4 (indicated by dashed lines with an arrow in FIG. 6) toward the resistive part 12 and ends with a closed end 1644a. The third path P3 has a third parallel component P31, parallel to the main current direction D1, and a third perpendicular component P32, perpendicular to the main current direction D1. The fourth path P4 has a fourth parallel component P41, parallel to the main current direction D1, and a fourth perpendicular component P42, perpendicular to the main current direction D1. The third parallel component P31, the third perpendicular component P32, the fourth parallel component P41, and the fourth perpendicular component P42 are nonzero. In the embodiment, the second start point S2 (i.e. where the third slot section 1642 and the fourth slot section 1644 are connected) is located substantially on a line that passes through the second sensing portion 162 and the second connecting portion 166 parallel to the main current direction D1. Furthermore, in the embodiment, the first connecting portion 146, the first through slot 144, the first sensing portion 142, the resistive part 12, the second sensing portion 162, the second through slot 164, and the second connecting portion 166 are arranged in order in the main current direction D1.

Because of the existence of the first through slot 144 and the second through slot 164, and the extension of two ends of the first through slot 144 and two ends of the second through slot 164 toward the resistive part 12, the current density at the first sensing portion 142 and the second sensing portion 1626 decreases, which reduces the sensing voltage deviation of the current passing through the resistor 2 through the first sensing portion 142 and the second sensing portion 162. In other words, the resistor 2 with the first through slot 144 and the second through slot 164 as a whole has a lower TCR than the resistor 2 without the first through slot 144 and the second through slot 164 as a whole. In addition, compared to the resistor 2, the resistor 1 has only one through slot (i.e. the first through slot 144) and therefore has relatively high heat-dissipation efficiency; in other words, when the resistors 1 and 2 are in operation, the resistor 1 has a lower operation temperature.

In addition, in the embodiment, the third slot section 1642 and the fourth slot section 1644 are symmetrical relative to the main current direction D1 or the second sensing portion 162. The first through slot 144 and the second through slot 164 are symmetrical relative to the resistive part 12. However, it is not limited thereto in practice. Therefore, the first through slot 144 and the variations thereof are also applicable to the resistor 2. For other descriptions about the second through slot 164 and variations therefor, please refer to the relevant descriptions of the first through slot 144 and the variations thereof, which will not be repeated in addition.

Figure 7:
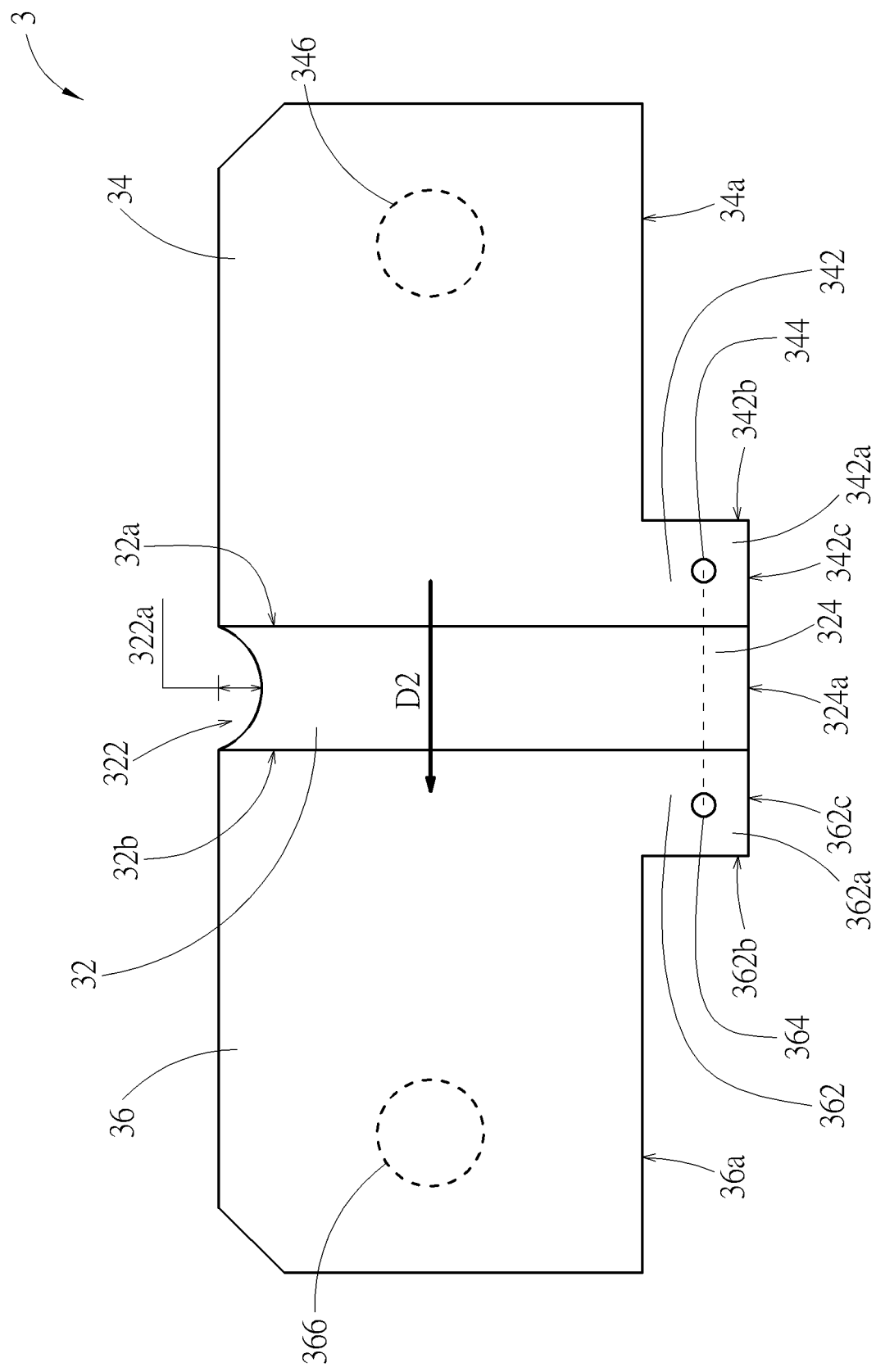
FIG. 7 is a top view of a resistor of another embodiment according to the invention.

Please refer to FIG. 7. A resistor 3 having low temperature coefficient of resistance according to an embodiment includes a resistive part 32, a first conductive part 34, and a second conductive part 36. The resistor 3 thereon defines a main current direction D2. The first conductive part 34 is connected to a side 32a of the resistive part 32 in the main current direction D2. The first conductive part has a first protrusion block 342, which extends outward perpendicular to the main current direction D2 and ends with an end 342a perpendicular to the main current direction D2. The first conductive part 34 also has a first sensing portion 344 (indicated by a circle in FIG. 7) at the first protrusion block 342 (or at the end 342a), and a first connecting portion 346 (indicated by a dashed circle in FIG. 7). The first protrusion block 342 is located between the first connecting portion 346 and the resistive part 12 in the main current direction D2. The second conductive part 36 is connected to another side 32b of the resistive part 32 relative to the first conductive part 34 in the main current direction D2. In addition, in some embodiments, the second conductive part 36 is connected to another side of the resistive part 32 rather than the opposite side 32b. The current will flow in accordance with this connection configuration, from the side 32a to the another side. This connection configuration is suitable for curved installation space. In practice, this connection configuration may cause an uneven current density distribution, the sizes of the resistive part 32, the first conductive part 34 and the second conductive part 36 may need to be enlarged accordingly.

In the embodiment, the second conductive part 32 has a second protrusion block 362, which extends outward perpendicular to the main current direction D2 and ends with an end 362a perpendicular to the main current direction D2. The second conductive part 36 also has a second sensing portion 364 (indicated by a circle in FIG. 7) at the second protrusion block 362 (or at the end 342a), and a second connecting portion 366 (indicated by a dashed circle in FIG. 7). The second protrusion block 362 is located between the second connecting portion 366 and the resistive part 12 in the main current direction D2. The first protrusion block 342 and the second protrusion block 362 are oppositely disposed relative to the resistive part 12.

When the resistor 3 is in operation, a current passes through the resistor 3 substantially in the main current direction D2, for example form the first connecting portion 346 to the second connecting portion 366. An edge 342b of the first protrusion block 342 adjoins an edge 34a of the first conductive part 34, forming an obstructing structure located between the first sensing portion 344 and the first connecting portion 346 substantially in the main current direction D2; the obstructing structure can at least partially obstruct the flow of the current through the first protrusion block 342. Similarly, an edge 362b of the second protrusion block 362 adjoins an edge 36a of the second conductive part 36, forming an obstructing structure located between the second sensing portion 364 and the second connecting portion 366 substantially in the main current direction D2; the obstructing structure can at least partially obstruct the flow of the current through the second protrusion block 362. Therefore, the obstructing structures can effectively reduce the sensing voltage deviation of the current through the first sensing portion 344 and the second sensing portion 364. In other words, the obstructing structures have the effect of reducing the TCR of the resistor 3.

In the embodiment, the resistor 3 has an indentation 322 formed at an edge of the resistive part 32 (opposite to the first protrusion block 342 and the second protrusion block 362 relative to the main current direction D2), e.g. by laser trimming, milling, punching, or other methods capable of removing material from the resistor 3. The indentation 322 has a depth 322a selected to adjust the resistance of the resistor 3. The resistive part 32 has a portion 324 between the first sensing portion 344 and the second sensing portion 364 (or between the first protrusion block 342 and the second protrusion block 362) in the main current direction D2; further, edges 324a, 342c and 362c of the resistive part 32, the first protrusion block 342, and the second protrusion block 362 are aligned. Preferably, the portion 324 is located on a reference line segment (indicated by a dashed line in FIG. 7) from the first sensing portion 344 to the second sensing portion 364; the resistive part 32 has no hole structure along the line segment, so the current can flow along the line segment through the portion 324. However, it is not limited thereto in practice.

Figure 8:
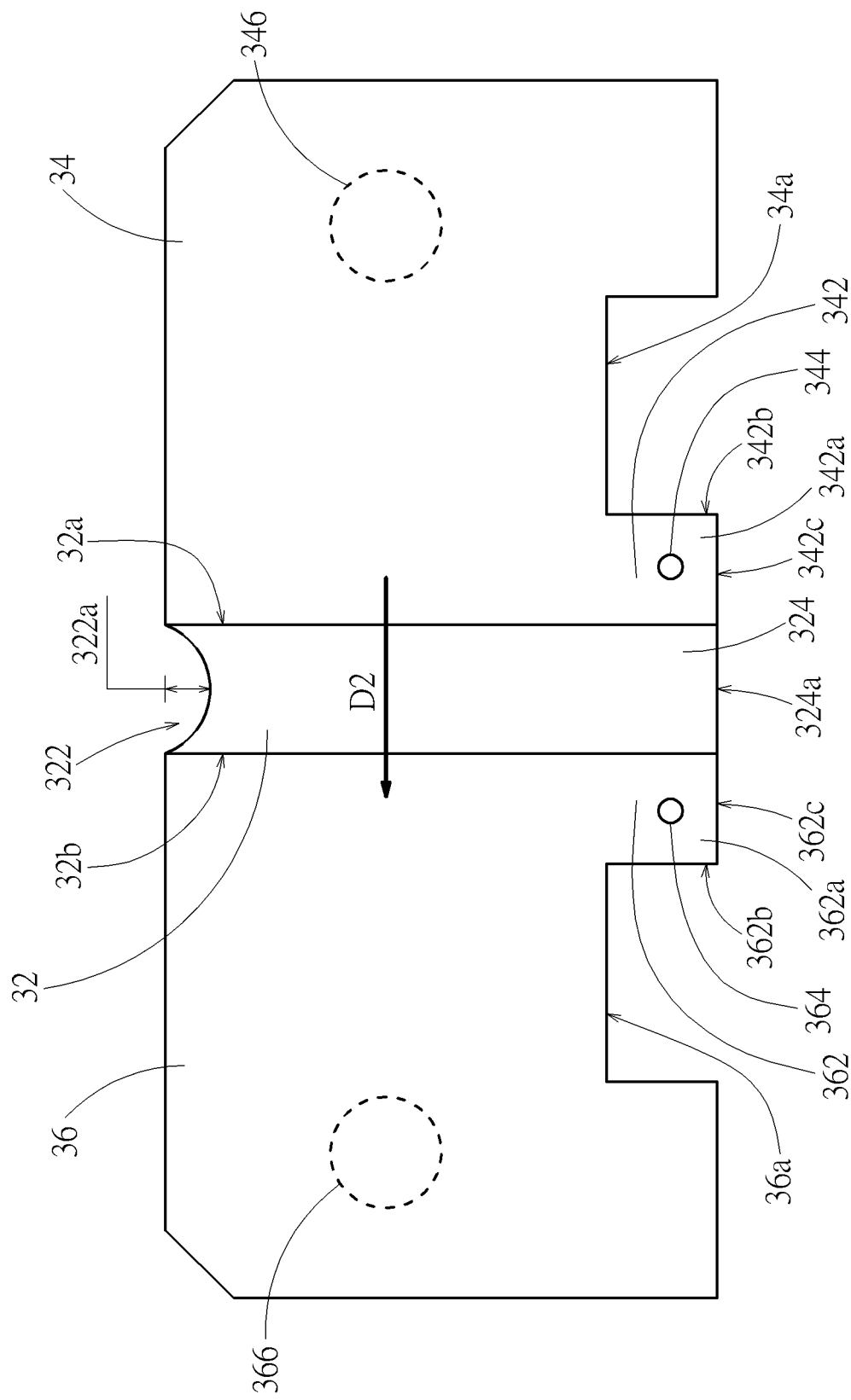
FIG. 8 is a top view of a resistor with an indentation at the edge of the first connecting portion.
Figure 9:
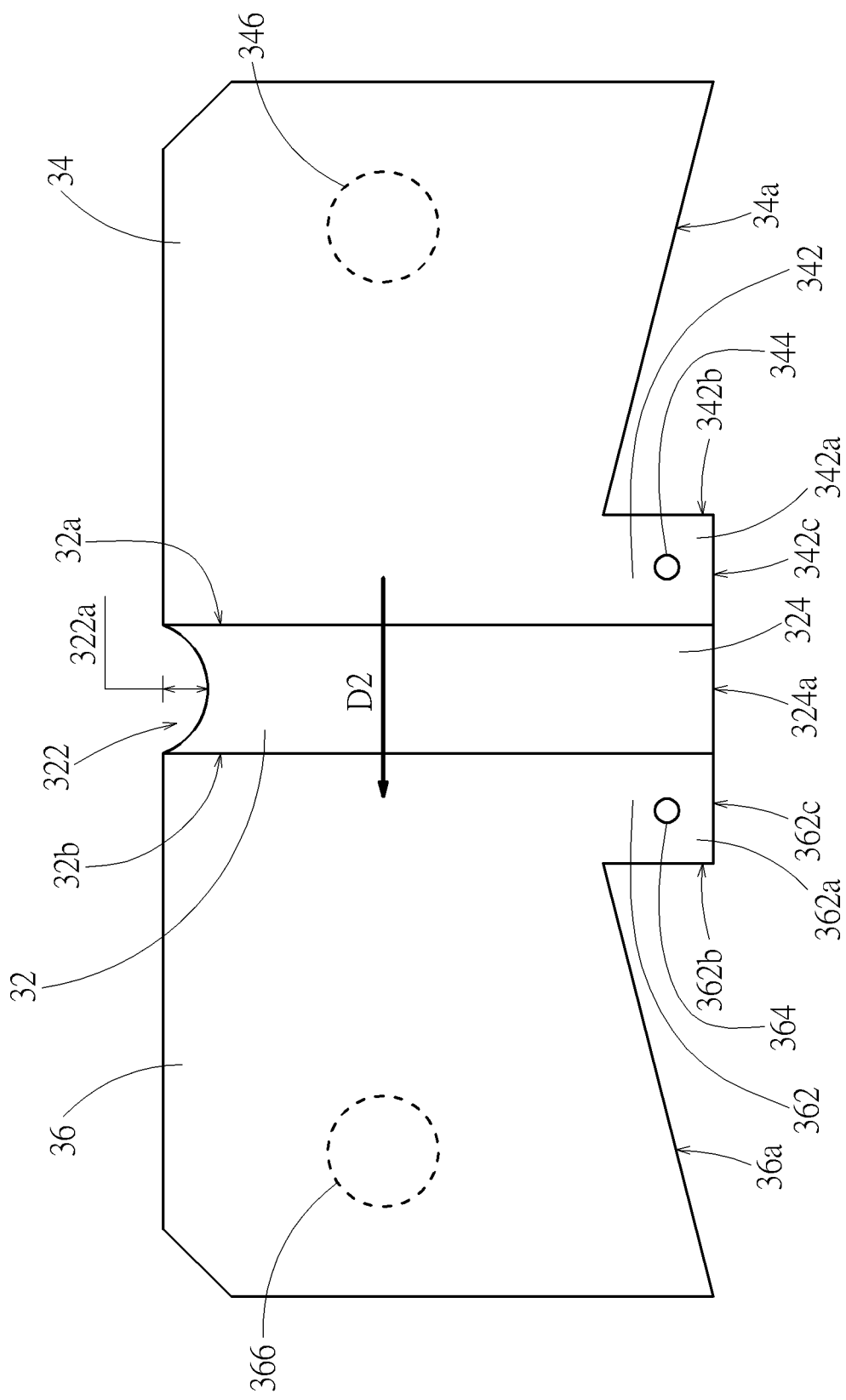
FIG. 9 is a top view of a resistor with a slanted edge of another embodiment.
Figure 10:
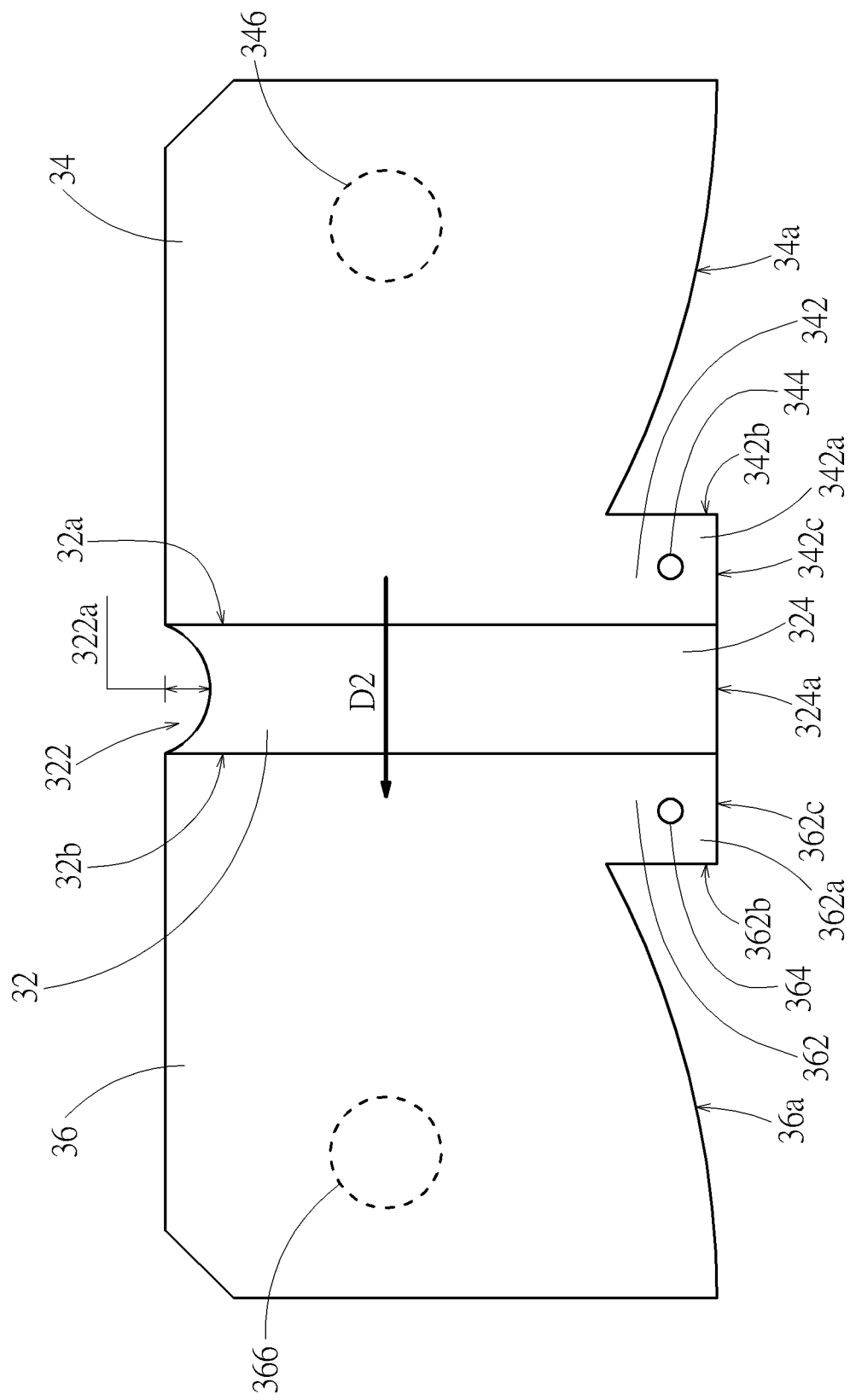
FIG. 10 is a top view of a resistor with a slanted edge of another embodiment.

Furthermore, in the embodiment, the edge 34a (of the conductive part 34) or the edge 36a (of the second conductive part 36) is a straight edge (or a horizontal line in the view point of FIG. 7) extending parallel to the main current direction D2. In practice, the edge 34a or the edge 36a can be formed by a bottom edge of an indentation as shown by FIG. 8. However, it is not limited thereto in practice. For example, the edge 34a can be a slanted edge, extending obliquely relative to the main current direction D2, as shown by FIG. 9. For another example, the edge 34a can be a curved edge, extending obliquely relative to the main current direction D2, as shown by FIG. 10. The above descriptions about the variations of the edge 34a are also applicable to the edge 36a of the second conductive part 36. In addition, in practice, the obstructing structures (formed by the edges 34a, 342b, 36a and 362a) can be provided easily by, but not limited to punching a metal plate.

Figure 11:
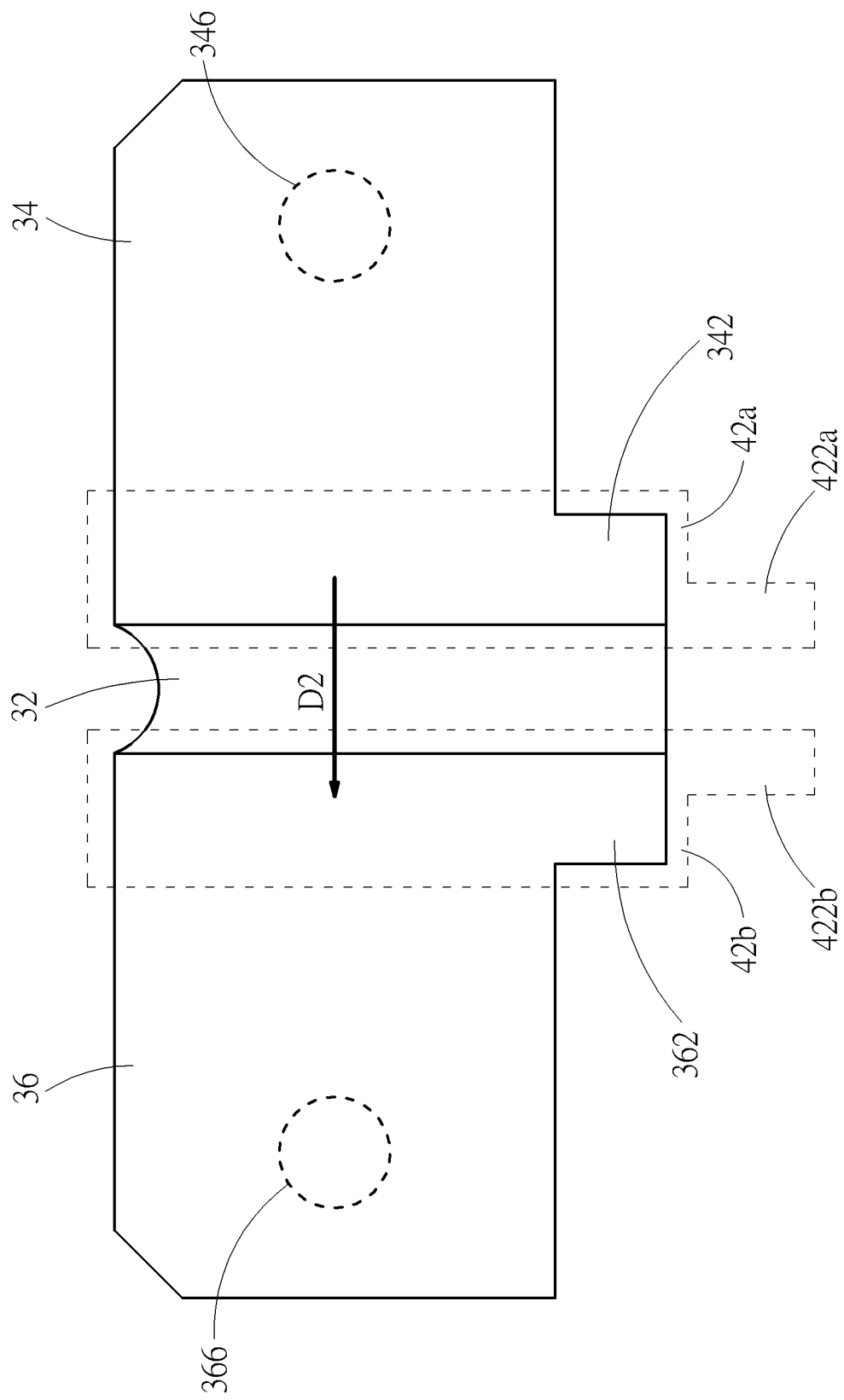
FIG. 11 is a top view of the resistor in FIG. 7 surface-mounted on pads in an application.

In addition, in practice, the resistor 3 can be surface-mounted to an external sensing circuit. For example, as shown by FIG. 11, the resistor 3 is surface-mounted to pads 42a and 42b (indicated by dashed lines in FIG. 11) of the external sensing circuit on a PCB (not shown in FIG. 11). The first protrusion block 342 and the second protrusion block 362 are directly mounted on the pads 42a and 42b respectively. The pads 42a and 42b extends to form leads 422a and 422b respectively as the sensing portions to be electrically connected to the external sensing circuit.

In the above embodiments, the obstructing structures (i.e. the first through slot 144 in the resistor 1 and the structure of the edges 34a and 342b in the resistor 3 for example) have the same or similar structural effect of at least partially obstructing the flow of the current through the resistors 1 and 3. For other descriptions about the resistor 3 and variations therefor, please refer to the relevant descriptions of the components with the same name of the resistor 1, which will not be repeated in addition.

Figure 12:
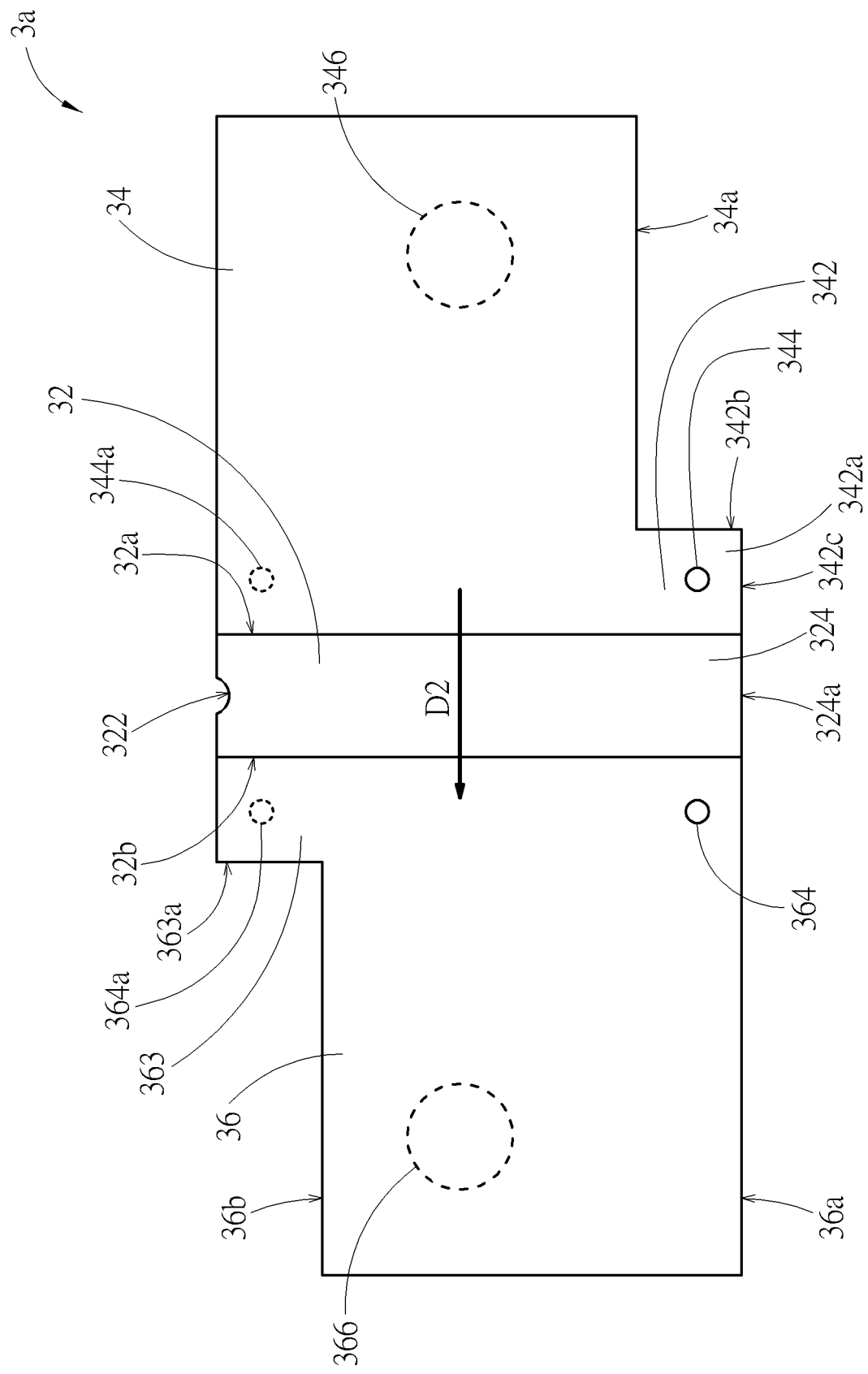
FIG. 12 is a top view of a resistor of another embodiment according to the invention.

In addition, in the above embodiments, the resistors 1, 1a, 1b 1c, and 3 are shown in symmetrical structures; however, it is not limited thereto in practice. For example, as shown in FIG. 12, a resistor 3a is structurally similar to the resistor 3. Only the first conductive part 34 of the resistor 3a has a protrusion block (i.e. the first protrusion block 342a) for disposing a sensing portion (i.e. the first sensing portion 344) thereon. The second sensing portion 364 of the second conductive part 36 and the first sensing portion 344 are disposed at the two sides of the resistive part 32 respectively. The obstructing structure, which is formed by the edge 342b of the first protrusion block 342 adjoining the edge 34a of the first conductive part 34, is still conducive to reducing the sensing voltage deviation of the current through the first sensing portion 344 and the second sensing portion 364 in a certain degree. In other words, the obstructing structure still has the effect of reducing the TCR of the resistor 3a. Furthermore, in the embodiment, the second conductive part 36 has a protrusion block 363 at another side of the second conductive part 36. The resistor 3a also can be provided with other sensing portions 344a and 364a (indicated by dashed circles in FIG. 12) on the first conductive part 34 and the second conductive part 36 respectively. An edge 363a of the protrusion block 363 and an edge 36b of the second conductive part 36 adjoin and form an obstructing structure located between the sensing portions 344a and 364a substantially in the main current direction D2. Therefore, the sensing portions 344a and 364a also can be used for sensing voltage like the sensing portions 344 and 364, which is conducive to the flexibility of disposition and design of the resistor 3a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor having low temperature coefficient of resistance, the resistor thereon defining a main current direction, the resistor comprising:
 a resistive part;

a first conductive part, connected to a side of the resistive part in the main current direction, the first conductive part having a first sensing portion and a first through slot, the first sensing portion being located between the first through slot and the resistive part, the first through slot comprising a first slot section and a second slot section which are located at two opposite sides of the first sensing portion relative to the main current direction and connected with each other, the first slot section extending from a first start point along a first path toward the resistive part and ending with a closed end, the second slot section extending from the first start point along a second path toward the resistive part and ending with a closed end, the first path having a first parallel component, parallel to the main current direction, and a first perpendicular component, perpendicular to the main current direction, the second path having a second parallel component, parallel to the main current direction, and a second perpendicular component, perpendicular to the main current direction, a portion of the first slot section that has the first parallel component and a portion of the second slot section that has the second parallel component defining a first ring opening and a first ring interior area, the first sensing portion being located within the first ring interior area; and a second conductive part, connected to another side of the resistive part in the main current direction, the second conductive part having a second sensing portion.

2. The resistor according to claim 1, wherein the first slot section and the second slot section are symmetrical relative to the main current direction or the first sensing portion.

3. The resistor according to claim 1, wherein the first through slot has a projection length in a direction perpendicular to the main current direction, the first conductive part has a width in the direction perpendicular to the main current direction, and the projection length is less than a half of the width.

4. The resistor according to claim 1, wherein the first through slot is provided in form of a C-shape, a square bracket, rectangular bracket, or an angle bracket.

5. The resistor according to claim 1, wherein the first slot section is provided in form of an arc, an L-shape, or a straight line.

6. The resistor according to claim 1, wherein the first conductive part has a connecting hole and an extension through slot, and the extension through slot connects the first through slot and the connecting hole.

7. The resistor according to claim 1, wherein the first conductive has a first connecting portion, and the first through slot is located between the first connecting portion and the first sensing portion along the main current direction.

8. The resistor according to claim 1, wherein the second conductive part has a second through slot, and the second sensing portion is located between the second through slot and the resistive part.

9. The resistor according to claim 8, wherein the second through slot comprises a third slot section and a fourth slot section which are located at two opposite sides of the second sensing portion relative to the main current direction and connected with each other, the third slot section extends from a second start point along a third path toward the resistive part and ends with a closed end, the fourth slot section extends from the second start point along a fourth path toward the resistive part and ends with a closed end, the third path has a third parallel component, parallel to the main current direction, and a third perpendicular component, perpendicular to the main current direction, and the fourth path has a fourth parallel component, parallel to the main current direction, a fourth perpendicular component, perpendicular to the main current direction, a portion of the third slot section that has the third parallel component and a portion of the fourth slot section that has the fourth parallel component define a second ring opening and a second ring interior area, and the second sensing portion is located within the second ring interior area.

10. The resistor according to claim 9, wherein the third slot section and the fourth slot section are symmetrical relative to the main current direction or the second sensing portion.

11. The resistor according to claim 8, wherein the first through slot and the second through slot are symmetrical relative to the resistive part.

12. The resistor according to claim 8, wherein the first conductive has a first connecting portion, the second conductive has a second connecting portion, and the first connecting portion, the first through slot, the first sensing portion, the resistive part, the second sensing portion, the second through slot, and the second connecting portion are arranged in order in the main current direction.

13. The resistor according to claim 1, wherein the resistive part has an indentation, and the indentation has a depth selected to adjust a resistance of the resistor.

14. The resistor according to claim 1, wherein the resistor has two non-slot portion for two current paths outside a closed end of the first slot section and a closed end of the second slot section respectively.

* * * * *